United States Patent
Lu et al.

(10) Patent No.: US 8,970,038 B2
(45) Date of Patent: Mar. 3, 2015

(54) SEMICONDUCTOR SUBSTRATE AND METHOD OF FABRICATING THE SAME

(71) Applicant: Siliconware Precision Industries Co., Ltd., Taichung Hsien (TW)

(72) Inventors: Chun-Hung Lu, Taichung Hsien (TW); Chung-Te Yuan, Taichung Hsien (TW); Guang-Hwa Ma, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/677,939

(22) Filed: Nov. 15, 2012

(65) Prior Publication Data
US 2014/0021617 A1   Jan. 23, 2014

(30) Foreign Application Priority Data
Jul. 18, 2012   (TW) .............................. 101125749 A

(51) Int. Cl.
H01L 23/48 (2006.01)
H01L 23/52 (2006.01)
H01L 29/40 (2006.01)
H01L 23/522 (2006.01)
H01L 21/768 (2006.01)
H01L 23/14 (2006.01)
H01L 23/498 (2006.01)

(52) U.S. Cl.
CPC ...... *H01L 23/5226* (2013.01); *H01L 21/76802* (2013.01); *H01L 23/147* (2013.01); *H01L 23/49822* (2013.01); *H01L 23/49827* (2013.01); *H01L 23/49833* (2013.01); *H01L 21/76898* (2013.01); *H01L 23/49816* (2013.01); *H01L 2224/16* (2013.01); *H01L 2224/73204* (2013.01)
USPC ......................................................... 257/758

(58) Field of Classification Search
USPC .................................. 257/678–733, 787–796,
257/E23.001–E23.194, E25.031–E25.032,
257/E23.042, 41, 81, 82, 91, 99, 177–182,
257/276, 457, 459, 502, 503, 573,
257/E23.01–E23.079, E23.141–E23.179,
257/626, 632–651, 584, 602, 621, 664–677,
257/734–786, E33.062–E33.066,
257/E31.124–E31.126, E51.019; 438/15,
438/26, 51, 55, 64, 106, 124–127, 6, 28, 66,
438/67, 107, 109, 406, 455–459, 98, 100,
438/584–688
See application file for complete search history.

(56) References Cited

U.S. PATENT DOCUMENTS

2011/0266683 A1* 11/2011 Feng .............................. 257/773
2012/0018876 A1* 1/2012 Wu et al. ........................ 257/737
2012/0133041 A1* 5/2012 Phee et al. ..................... 257/737
2013/0210198 A1* 8/2013 Lin ................................ 438/126

* cited by examiner

*Primary Examiner* — Dao H Nguyen
*Assistant Examiner* — Tram H Nguyen
(74) *Attorney, Agent, or Firm* — Mintz Levin Cohn Ferris Glovsky and Popeo, P.C.; Peter F. Corless; Steven M. Jensen

(57) ABSTRACT

A semiconductor substrate is provided, including: a substrate; a plurality of conductive through vias embedded in the substrate; a first dielectric layer formed on the substrate; a metal layer formed on the first dielectric layer; and a second dielectric layer formed on the metal layer. As such, when a packaging substrate is disposed on the second dielectric layer, the metal layer provides a reverse stress to balance thermal stresses caused by the first and second dielectric layers, thereby preventing warpage of the semiconductor substrate.

20 Claims, 6 Drawing Sheets

SEMICONDUCTOR SUBSTRATE AND METHOD OF FABRICATING THE SAME

CROSS-REFERENCES TO RELATED APPLICATIONS

This application claims under 35 U.S.C. §119(a) the benefit of Taiwanese Application No. 101125749, filed Jul. 18, 2012, the entire contents of which is incorporated herein by reference.

BACKGROUND OF THE INVENTION

1. Field of the Invention

The present invention relates to semiconductor substrates, and, more particularly, to a semiconductor substrate having through silicon vias and a method of fabricating the same.

2. Description of Related Art

Currently, packaging substrates are required to be configured corresponding to fine pitches of semiconductor chips so as to be integrated with the semiconductor chips. On the other hand, the coefficient of thermal expansion (CTE) mismatch between a chip, which generally has a CTE of 3 ppm/° C., and a packaging substrate, which generally has a CTE of 18 ppm/° C., easily causes large thermal stresses and warpages to occur, thus reducing the product reliability and resulting in the failure of a reliability test.

Accordingly, through silicon via interposer technologies have been developed to meet the miniaturization and high performance requirements of semiconductor packages. Referring to FIG. 1A, an interposer 1 is disposed between a packaging substrate 6 and a semiconductor chip 5 to alleviate the problem of CTE mismatch between the packaging substrate 6 and the semiconductor chip 5.

Generally, a plurality of through holes are formed in a silicon substrate 10 and filled with a conductive material so as to form a plurality of through silicon vias (TSVs) 11, and a redistribution layer (RDL) structure 12 is further formed on an upper surface 10a of the silicon substrate 10, thereby forming the interposer 1. The interposer 1 is further disposed on the packaging substrate 6 through a plurality of conductive bumps 60, and the semiconductor chip 5 is electrically connected to the RDL structure 12 of the interposer 1 through a plurality of solder bumps 50. Furthermore, an underfill 51 is filled between the interposer 1 and the semiconductor chip 5 to encapsulate the solder bumps 50.

However, the lower surface 10b of the interposer 1 is made of a dielectric material. Referring to FIG. 1B, when the interposer 1 is thin, the CTE mismatch will occur between the interposer 1 and the packaging substrate 6. As such, thermal stresses and warpages can easily occur to the interposer 1, thereby reducing the product reliability and resulting in failure of a reliability test.

SUMMARY OF THE INVENTION

The present invention provides a semiconductor substrate, which comprises: a substrate having a first surface and a second surface opposite to the first surface; a plurality of conductive through vias embedded in the substrate, each of the conductive through vias having a first end surface exposed from the first surface of the substrate and a second end surface opposite to the first end surface and protruded from the second surface of the substrate; a first dielectric layer formed on the second surface of the substrate; a metal layer formed on the first dielectric layer; and a second dielectric layer formed on the metal layer.

The present invention further provides a method of fabricating a semiconductor substrate, comprising: providing a substrate having opposite first and second surfaces and a plurality of conductive through vias embedded in the substrate, wherein each of the conductive through vias has a first end surface exposed from the first surface of the substrate and a second end surface opposite to the first end surface and protruded from the second surface of the substrate; forming a first dielectric layer on the second surface of the substrate; forming a metal layer on the first dielectric layer; and forming a second dielectric layer on the metal layer.

In an embodiment, a dielectric material is formed on side surfaces of the conductive through vias.

In an embodiment, the second end surfaces of the conductive through vias are flush with a surface of the second dielectric layer.

In an embodiment, the first dielectric layer is made of oxide or nitride.

In an embodiment, the second dielectric layer is made of oxide or nitride.

In an embodiment, the metal layer is made of Cu, Ti or Al.

In an embodiment, a redistribution layer (RDL) structure is further formed on the first surface of the substrate and the first end surfaces of the conductive through vias and electrically connected to the first end surfaces of the conductive through vias so as for a semiconductor element to be disposed on the RDL structure.

In an embodiment, an RDL structure is further formed on the second dielectric layer and the second end surfaces of the conductive through vias and electrically connected to the second end surfaces of the conductive through vias so as for a semiconductor element to be disposed on the RDL structure.

According to the present invention, when a packaging substrate is disposed on the second dielectric layer, the metal layer formed between the first and second dielectric layers provides a reverse stress to balance thermal stresses caused by the first and second dielectric layers, thereby preventing warpage of the semiconductor substrate and improving the product reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms, such as "upper", "lower", "first", "second", "a" etc., are only used as a matter of descriptive convenience and not intended to have any other significance or provide limitations for the present invention.

FIGS. 2A to 2E are cross-sectional views showing a method of fabricating a semiconductor substrate 2 according to the present invention.

Figure 1A:
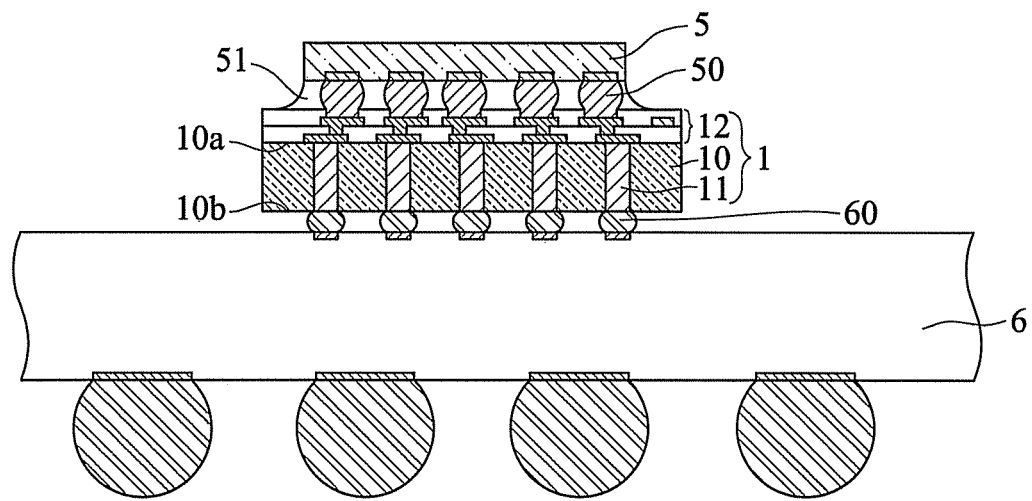
FIGS. 1A and 1B are cross-sectional views showing a conventional semiconductor package.
Figure 1B:
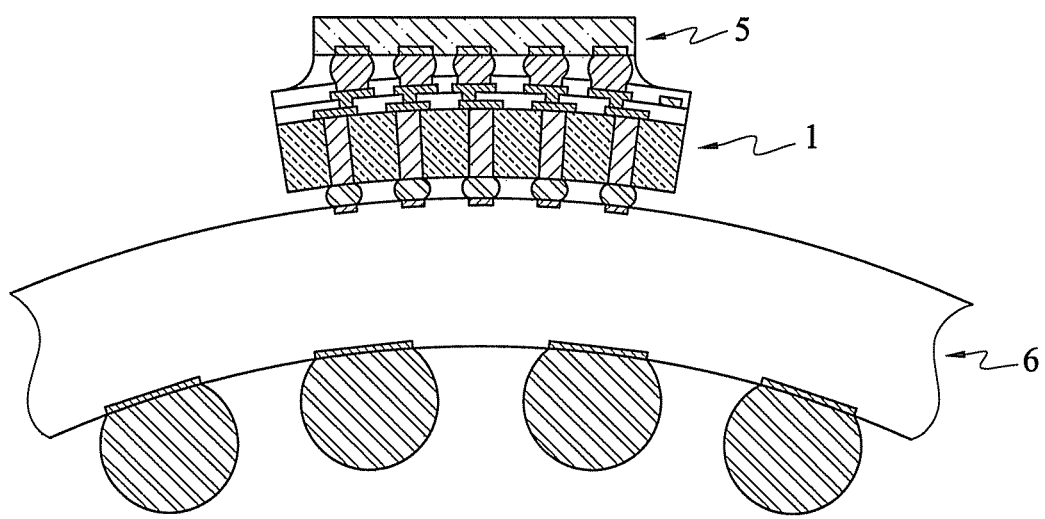
Figure 2A:
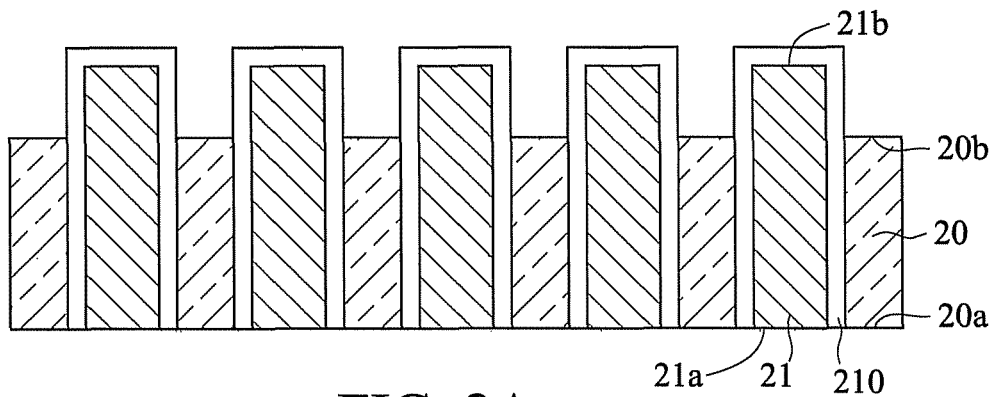
FIGS. 2A to 2E are cross-sectional views showing a semiconductor substrate according to a first embodiment of the present invention.

Referring to FIG. 2A, a substrate 20 having a first surface 20a and a second surface 20b opposite to the first surface 20a is provided, and a plurality of conductive through vias 21 are formed in the substrate 20. Each of the conductive through vias 21 has a first end surface 21a exposed from the first surface 20a of the substrate 20 and a second end surface 21b opposite to the first end surface 21a and protruded from the second surface 20b of the substrate 20.

In an embodiment, the substrate 20 is made of silicon and serves as an interposer in a package structure.

The conductive through vias 21 are formed through a etching and plating process.

Each of the conductive through vias 21 has a dielectric material 210 formed on side surfaces of the conductive through vias 21 and the second end surface 21b of the conductive through vias thereof. The dielectric material 210 can be made of oxide or nitride, such as silicon dioxide or silicon nitride.

Figure 2B:
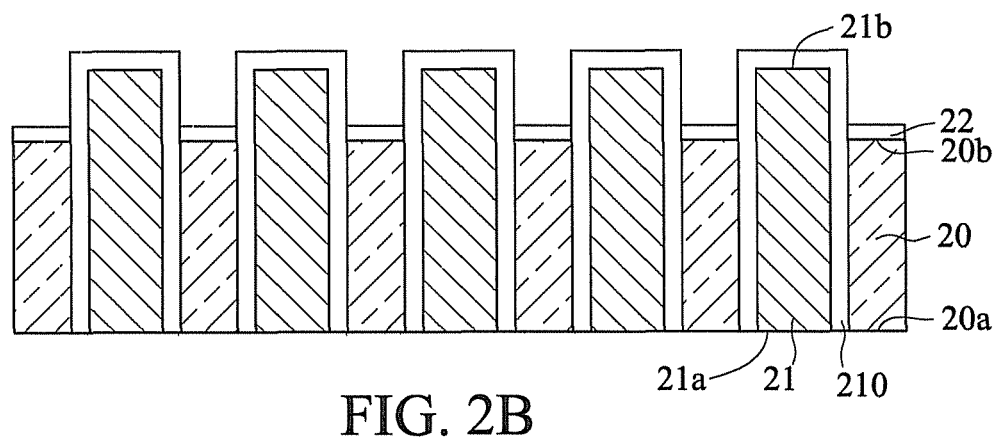

Referring to FIG. 2B, a first dielectric layer 22 is formed on the second surface 20b of the substrate 20.

In an embodiment, the first dielectric layer 22 is made of silicon nitride and has a thickness between 0.2 and 2 um.

Figure 2C:
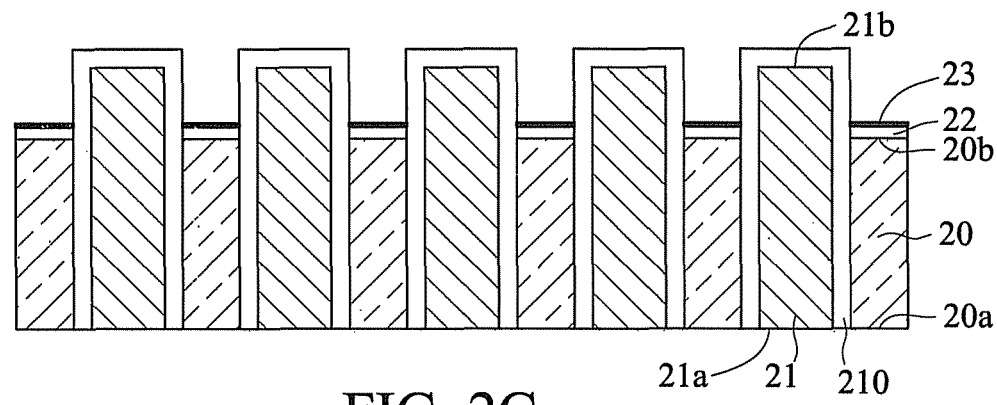

Referring to FIG. 2C, a metal layer 23 is formed on the first dielectric layer 22. The metal layer 23 can be made of, for example, but not limited to Cu, Ti or Al.

Figure 2D:
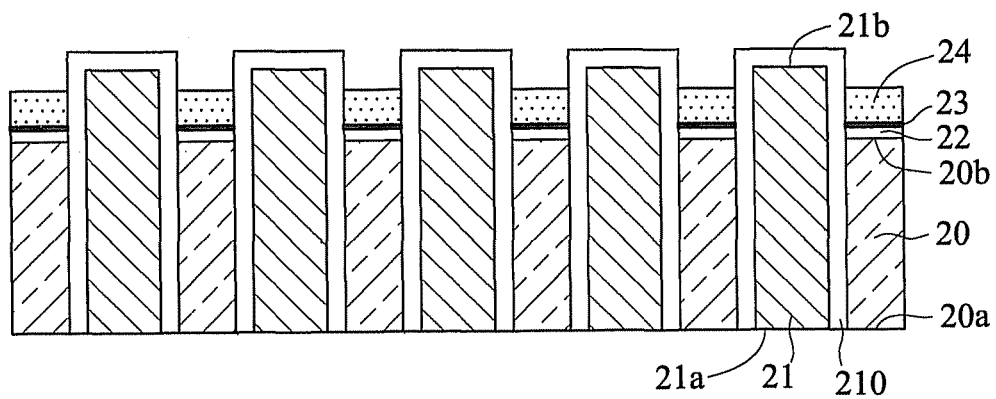

Referring to FIG. 2D, a second dielectric layer 24 is formed on the metal layer 23.

In an embodiment, the second dielectric layer 24 is made of silicon dioxide and has a thickness between 1 and 3 um.

Figure 2E:
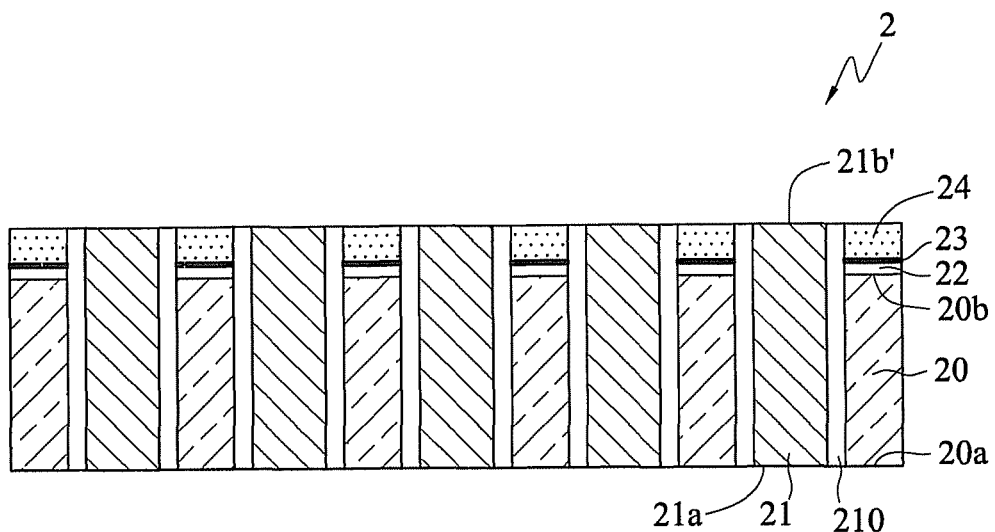

Referring to FIG. 2E, performing a removing process, such as etching process or grinding process, a portion of the conductive through vias 21 which is protruding from the dielectric material 210 are removed so as to make that the second end surfaces 21b' of the conductive through vias 21 are flush with the upper surface of the second dielectric layer 24. The upper surface of the second dielectric layer 24 contains copper.

According to the present invention, the metal layer 23 serves as a reverse stress layer to provide a reverse stress during a packaging process, thereby balancing thermal stresses caused by the circuit formed in the substrate, the first dielectric layer 22 and the second dielectric layer 24.

Figure 3A:
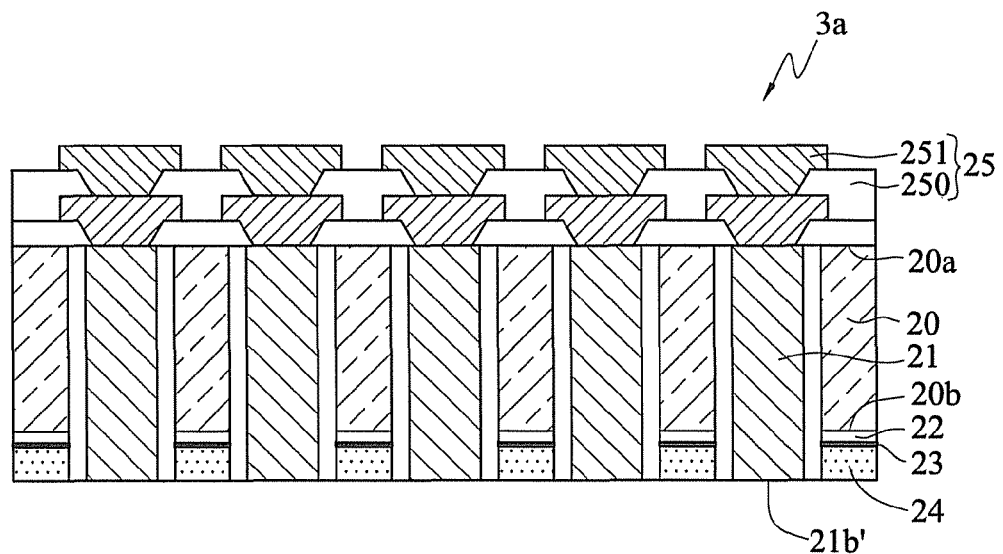
FIGS. 3A and 3B are cross-sectional views showing a semiconductor substrate according to a second embodiment of the present invention.

Referring to FIG. 3A, a first RDL structure 25 is formed on the first surface 20a of the substrate 20 and the first end surfaces 21a of the conductive through vias 21. In an embodiment, the first RDL structure 25 has two dielectric layers 250, and a plurality of circuit layers 251 formed on the dielectric layers 250 and electrically connected to the first end surfaces 21a of the conductive through vias 21.

Figure 3B:
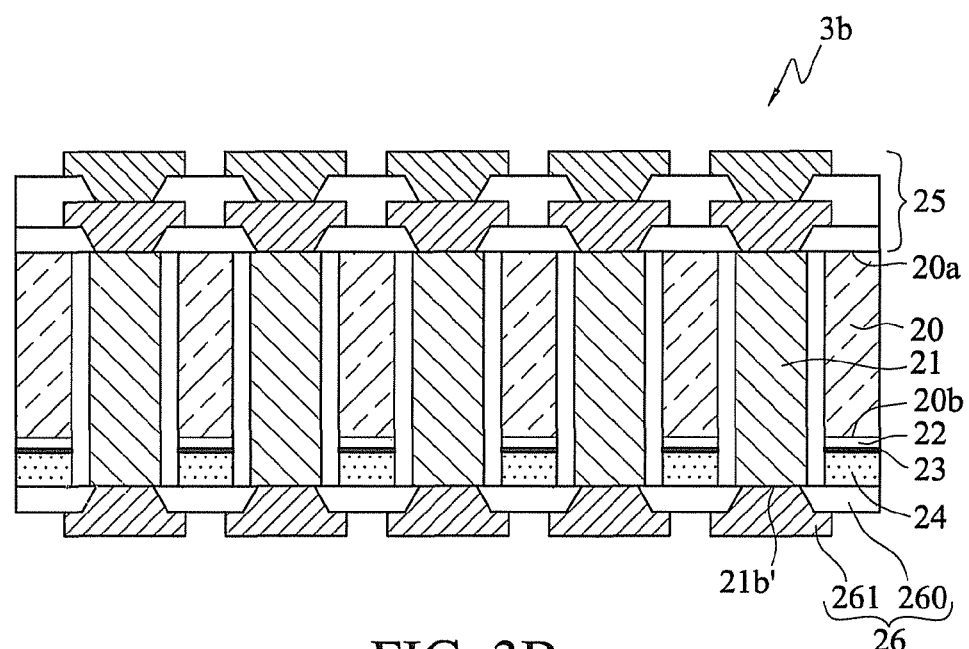

Further, referring to FIG. 3B, a second RDL structure 26 can be formed on the second dielectric layer 24 and the second end surfaces 21b' of the conductive through vias 21. In an embodiment, the second RDL structure 26 has a dielectric layer 260 and a circuit layer 261 formed on the dielectric layer 260 and electrically connected to the second end surfaces 21b of the conductive through vias 21.

In another embodiment, only the second RDL structure 26 is formed, and the first RDL structure 25 is not formed.

It should be noted that the number of layers of the first or second RDL structure 25, 26 can be changed according to the practical need without being limited to the above-described embodiments.

Figure 4A:
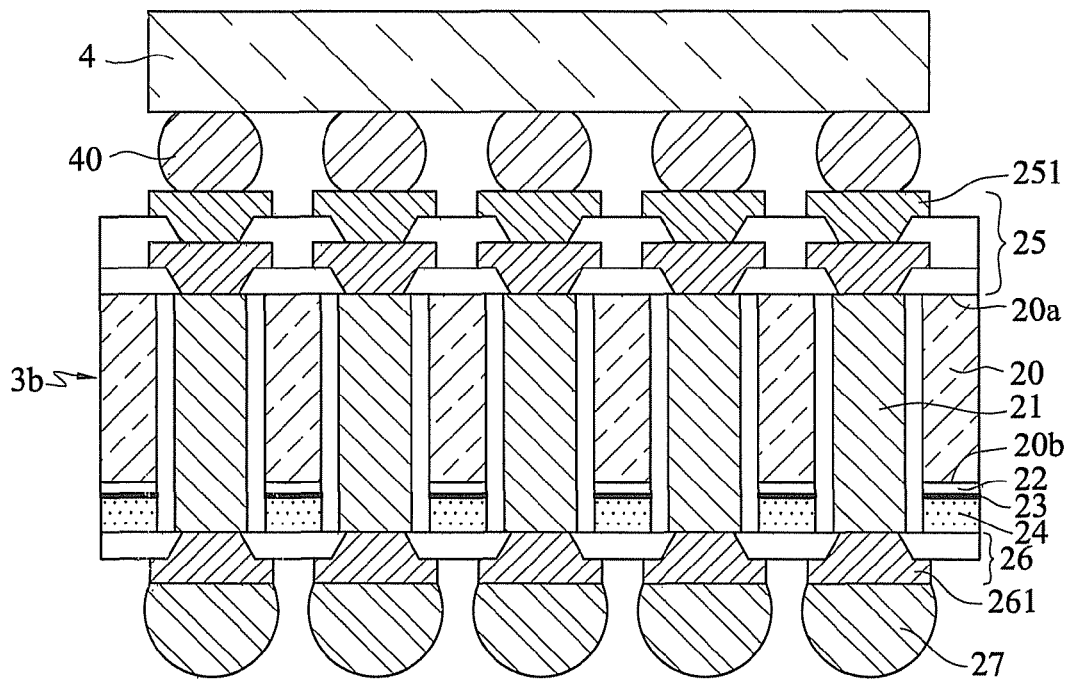
FIGS. 4A and 4B are cross-sectional vies showing an application of the semiconductor substrate of the present invention.

The semiconductor substrate 2, 3a, 3b can further be disposed on a packaging substrate (not shown) through one side having the second dielectric layer 24, i.e., the second surface 20b of the substrate 20. For example, referring to FIG. 4A, the circuit layer 261 of the second RDL structure 26 of the semiconductor substrate 3b is disposed on a packaging substrate (not shown) through a plurality of conductive bumps 27 such as solder balls.

Further, a semiconductor element 4 such as a chip is disposed on the first RDL structure 25 through a plurality of conductive bumps 40 such as solder balls that electrically connect the semiconductor element 4 and the circuit layer 251.

The metal layer 23 of the substrate 3b provides a reverse stress to balance thermal stresses caused by the first dielectric layer 22 and the second dielectric layer 24. Therefore, the CTE mismatch occurs between the semiconductor substrate 3b and the packaging substrate will be reduced when the semiconductor substrate 3b has a small thickness, thereby preventing warpage from occurring to the semiconductor substrate 3b and improving the product reliability.

Figure 4B:
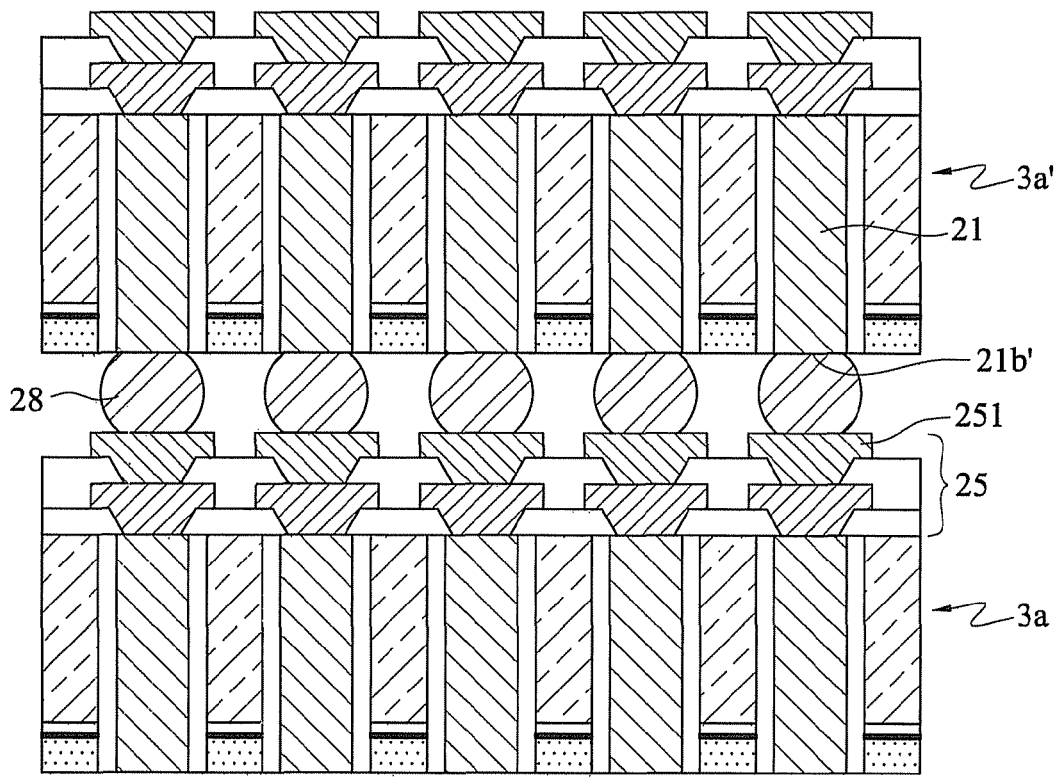

In an embodiment, two semiconductor substrates 3a, 3a' are stacked on each other and electrically connected to the corresponding functions. Referring to FIG. 4B, the second end surfaces 21b' of the conductive through vias 21 of the semiconductor substrate 3a' are disposed on the circuit layer 251 of the first RDL structure 25 of the semiconductor substrate 3a through a conductive adhesive or a plurality of conductive bumps 28.

Figure 5:
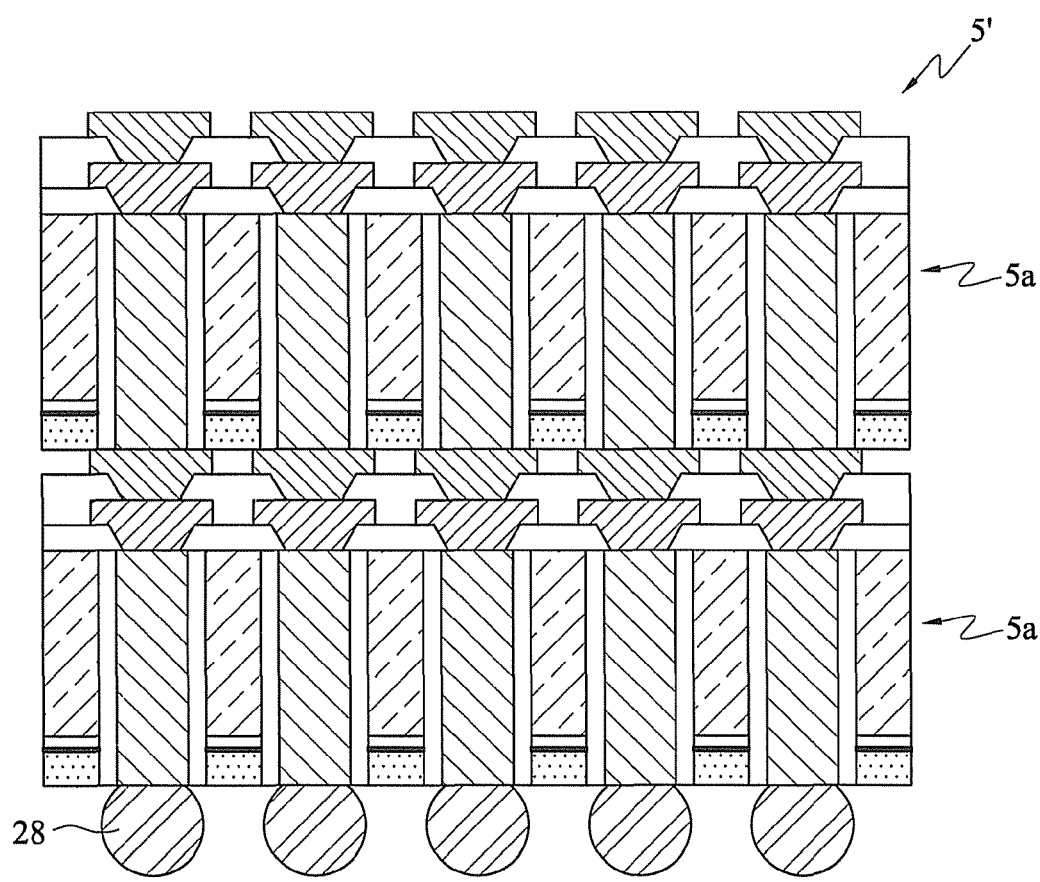
FIG. 5 is a cross-sectional view showing another application of the semiconductor substrate of the present invention.

FIG. 5 is a cross-sectional view showing a 3D chip stack structure 5'. A plurality of semiconductor substrates 5a such as semiconductor chips with a plurality of active components are stacked on one another. In a subsequent process, the stack structure 5' can be disposed on a packaging substrate (not shown) through a plurality of conductive bumps 28 such as solder balls.

The present invention further provides a semiconductor substrate 2, which has: a substrate 20 having a first surface 20a and a second surface 20b opposite to the first surface 20a; a plurality of conductive through vias 21 embedded in the substrate 20, each of the conductive through vias having a first end surface 21a exposed from the first surface 20a of the substrate 20 and a second end surface 21b opposite to the first end surface 21a and protruding from the second surface 20b of the substrate 20; a first dielectric layer 22 formed on the second surface 20b of the substrate 20; a metal layer 23 formed on the first dielectric layer 22; and a second dielectric layer 24 formed on the metal layer 23.

Further, a dielectric material 210 is formed on side surfaces of the conductive through vias 21. The first dielectric layer 22 can be made of oxide or nitride. The metal layer can be made of Cu, Ti or Al. The second dielectric layer 24 can be made of oxide or nitride. The second end surfaces 21b of the conductive through vias 21 are flush with an upper surface of the second dielectric layer 24. In other embodiments, the upper surface of the second dielectric layer 24 contains copper.

The substrate 3a further has a first RDL structure 25 formed on the first surface 20a of the substrate 20 and the first end surfaces 21a of the conductive through vias 21 and electrically connecting the first end surfaces 21a of the conductive through vias 21. A semiconductor element 4 can further be disposed on the first RDL structure 25.

The substrate 3a further has a second RDL structure 26 formed on the second dielectric layer 24 and the second end surfaces 21b' of the conductive through vias 21 and electrically connecting the second end surfaces 21b' of the conductive through vias 21. A semiconductor element (not shown) can further be disposed on the second RDL structure 26.

According to the present invention, the metal layer formed between the first and second dielectric layers provides a reverse stress during a packaging process so as to balance thermal stresses caused by the first and second dielectric layers, thereby effectively preventing warpage of the semiconductor substrate and improving the product reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor substrate, comprising:
    a substrate having a first surface and a second surface opposite to the first surface;
    a plurality of conductive through vias embedded in the substrate, the conductive through vias each having a first end surface exposed from the first surface of the substrate and a second end surface opposite to the first end surface and protruded from the second surface of the substrate;
    a first dielectric layer formed directly on the second surface of the substrate;
    a metal layer formed directly on the first dielectric layer; and
    a second dielectric layer formed directly on the metal layer.

2. The semiconductor substrate of claim 1, further comprising a dielectric material formed on side surfaces of the conductive through vias.

3. The semiconductor substrate of claim 1, wherein the second end surfaces of the conductive through vias are flush with a surface of the second dielectric layer.

4. The semiconductor substrate of claim 1, wherein the first dielectric layer is made of oxide or nitride.

5. The semiconductor substrate of claim 1, wherein the second dielectric layer is made of oxide or nitride.

6. The semiconductor substrate of claim 1, wherein the metal layer is made of Cu, Ti or Al.

7. The semiconductor substrate of claim 1, further comprising a redistribution layer (RDL) structure formed on the first surface of the substrate and the first end surfaces of the conductive through vias and electrically connected to the first end surfaces of the conductive through vias.

8. The semiconductor substrate of claim 7, further comprising a semiconductor element disposed on the RDL structure.

9. The semiconductor substrate of claim 1, further comprising an RDL structure formed on the second dielectric layer and the second end surfaces of the conductive through vias and electrically connected to the second end surfaces of the conductive through vias.

10. The semiconductor substrate of claim 9, further comprising a semiconductor element disposed on the RDL structure.

11. A method of fabricating a semiconductor substrate, comprising:
    providing a substrate having a first surface and a second surface opposite to the first surface and a plurality of conductive through vias embedded in the substrate, wherein each of the conductive through vias has a first end surface exposed from the first surface of the substrate and a second end surface opposite to the first end surface and from the second surface of the substrate;
    forming a first dielectric layer directly on the second surface of the substrate;
    forming a metal layer directly on the first dielectric layer; and
    forming a second dielectric layer directly on the metal layer.

12. The method of claim 11, further comprising forming a dielectric material on side surfaces of the conductive through vias.

13. The method of claim 11, wherein the second end surfaces of the conductive through vias are flush with a surface of the second dielectric layer.

14. The method of claim 11, wherein the first dielectric layer is made of oxide or nitride.

15. The method of claim 11, wherein the second dielectric layer is made of oxide or nitride.

16. The method of claim 11, wherein the metal layer is made of Cu, Ti or Al.

17. The method of claim 11, further comprising forming an RDL structure on the first surface of the substrate and the first end surfaces of the conductive through vias, wherein the RDL structure is electrically connected to the first end surfaces of the conductive through vias.

18. The method of claim 17, further comprising disposing a semiconductor element on the RDL structure.

19. The method of claim 11, further comprising forming an RDL structure on the second dielectric layer and the second end surfaces of the conductive through vias, wherein the RDL structure is electrically connected to the second end surfaces of the conductive through vias.

20. The method of claim 19, further comprising disposing a semiconductor element on the RDL structure.

* * * * *